United States Patent [19]
Vasseghi et al.

[11] Patent Number: 4,612,458
[45] Date of Patent: Sep. 16, 1986

[54] MERGED PMOS/BIPOLAR LOGIC CIRCUITS

[75] Inventors: Nader Vasseghi, Mountain View; Donald G. Goddard, Cupertino, both of Calif.

[73] Assignee: Advanced Micro Devices, Inc., Sunnyvale, Calif.

[21] Appl. No.: 770,817

[22] Filed: Aug. 28, 1985

[51] Int. Cl.$^4$ .................. H03K 19/08; H03K 19/003; H03K 17/16; H03K 17/56

[52] U.S. Cl. ..................................... 307/446; 307/443; 307/570; 307/270

[58] Field of Search ............... 307/443, 446, 448, 454, 307/570, 270, 254, 456–458

[56] References Cited

U.S. PATENT DOCUMENTS 3,541,353 11/1970 Seelbach et al. ..................... 307/446
3,609,479 9/1971 Lin et al. .......................... 307/446 X
4,301,383 11/1981 Taylor ............................. 307/446 X
4,558,234 12/1985 Suzuki et al. ....................... 307/446

FOREIGN PATENT DOCUMENTS 0099100 1/1984 European Pat. Off. ............ 307/570
0145004 6/1985 European Pat. Off. ............ 307/446
25423 2/1984 Japan ................................. 307/446
25424 2/1984 Japan ................................. 307/446
79641 5/1984 Japan ................................. 307/446

Primary Examiner—Larry N. Anagnos
Attorney, Agent, or Firm—Patrick T. King; Davis Chin; J. Vincent Tortolano

[57] ABSTRACT

Logic circuits formed of merged P-channel MOS transistors and bipolar transistors to produce a single logic gate include a plurality of P-channel MOS transistors and a pair of bipolar transistors. The logic gate circuits have low power dissipation and a large noise margin.

10 Claims, 2 Drawing Figures

4,612,458

MERGED PMOS/BIPOLAR LOGIC CIRCUITS

DESCRIPTION

Background of the Invention

This invention relates generally to logic gate circuits and more particularly, it relates to a composite P-channel metal-oxide-semiconductor (PMOS)/bipolar logic gate circuit which has low power dissipation and a large noise margin.

Conventional logic gate circuits employing bipolar transistors such as TTL, STTL and ECL are generally well known in the prior art. The major defect of these prior art circuits is that they consume large amounts of power. Another problem with the conventional gate circuits is that they are susceptible to spurious noise transients which are likely to occur in the typical commercial and industrial environments.

It would therefore be desirable to provide a merged PMOS/bipolar logic gate circuit which has the advantages of low power consumption and higher immunity to spurious noise transients. The present invention is achieved by utilizing PMOS transistors which are available in an N-expitaxial bipolar process for the fabrication of bipolar transistors. As a result, PMOS transistors and bipolar transistors are merged to form a single logic gate.

SUMMARY OF THE INVENTION

Accordingly, it is a general object of the present invention to provide a merged PMOS/bipolar logic gate circuit which is relatively simple and economical to manufacture and assemble, but yet overcomes the disadvantages of the conventional logic gate circuits.

It is an object of the present invention to provide a merged PMOS/bipolar logic gate circuit which has low power consumption and high noise immunity.

It is another object of the present invention to provide an inverter circuit formed of merged P-channel transistors and bipolar transistors to produce a single logic gate which includes a pair of P-channel MOS transistors and a pair of bipolar transistors.

It is still another object of the present invention to provide a NOR circuit formed of merged P-channel transistors and bipolar transistors to produce a single logic gate which includes a plurality of P-channel MOS transistors and a pair of bipolar transistors.

In accordance with these aims and objectives, the present invention is concerned with the provision of an inverter circuit formed of merged P-channel MOS transistors and bipolar transistors to produce a single logic gate which includes a first P-channel MOS transistor having its gate connected to an input terminal and its source connected to a supply potential. A first bipolar transistor has its collector connected to the supply potential, its base connected to the drain of the first P-channel transistor, and its emitter connected to an output terminal. A first resistor has its one end connected to the drain of the first P-channel transistor and to the base of the first bipolar transistor. The other end of the first resistor is connected to the emitter of the first bipolar transistor and to the output terminal. A second P-channel MOS transistor has its gate and source connected together and its drain connected to the gate of the first P-channel transistor and to the input terminal. A second bipolar transistor has its collector connected to the output terminal, its base connected to the gate and source of the second P-channel transistor, and its emitter connected to a ground potential. A second resistor has its one end connected to the base of the second bipolar transistor and its other end connected to the emitter of the second bipolar transistor.

In another aspect of the present invention, a NOR logic gate circuit is provided which is formed of four P-channel MOS transistors and a pair of bipolar transistors.

BRIEF DESCRIPTION OF THE DRAWINGS

These and other objects and advantages of the present invention will now become more fully apparent from the following detailed description which read in conjunction with the accompanying drawings with like reference numerals indicating corresponding parts throughout, wherein.

DESCRIPTION OF THE PREFERRED EMBODIMENTS

Figure 1:
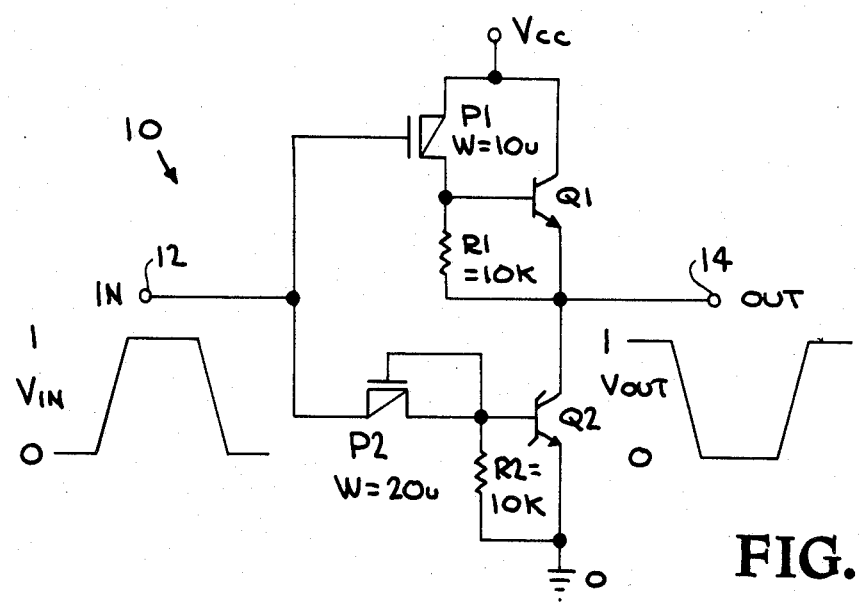
FIG. 1 is a schematic diagram of a merged PMOS/bipolar logic circuit functioning as an inverter circuit in accordance with the present invention.

Referring now in detail to the drawings, there is shown in FIG. 1 a merged PMOS/bipolar logic gate circuit 10 of the present invention which functions as an inverter circuit. The logic gate circuit 10 has an input terminal 12 and an output terminal 14. The logic circuit 10 includes a first P-channel MOS transistor P1, a second P-channel MOS transistor P2, an output-stage bipolar transistor Q1, a pull-down bipolar transistor Q2, a pull-up resistor R1 and a pull-down resistor R2.

The first P-channel MOS transistor P1 has its source electrode connected to a supply voltage or potential VCC, its drain electrode connected to the base of the output-stage bipolar transistor Q1, and its gate connected to the input terminal 12. The supply potential VCC is typically about +5.0 volts. The input terminal 12 receives an input logic signal $V_{in}$ which swings between a low or "0" logic state and a high "1" logic state. The second P-channel MOS transistor P2 has its gate and source electrodes connected together and to the base of the pull-down bipolar transistor Q2. The drain of the P-channel transistor P2 is also connected to the input terminal 12.

The output-stage bipolar transistor Q1 has its collector connected to the supply potential VCC, its base connected to one end of the pull-up resistor R1, and its emitter connected to the other end of the resistor R1. The other end of the resistor R1 is also tied to the output terminal 14. The pull-down bipolar transistor Q2 has its collector connected to the emitter of the output-stage bipolar transistor Q1 and to the output terminal 14. The base of the bipolar transistor Q2 is connected to one end of the pull-down resistor R2, and the emitter of the bipolar transistor Q2 is connected to the other end of the pull-down resistor R2 and to a ground potential.

The output-stage bipolar transistor Q1 defines a current source transistor and operates as a pull-up device. The bipolar transistor Q2 defines a current sink transistor and operates as a pull-down device. These transistors Q1 and Q2 are operated in what is commonly known as a "push/pull" fashion. The bipolar transistors have the advantage over the MOS transistors in that the former has the ability of providing higher current source/sink capabilities used for driving capacitive output loads.

The pull-down bipolar transistor Q2 is preferably a Schottky transistor so as to avoid saturation, thereby permitting a higher switching speed of operation. The resistor R1 provides a discharge path from the base of the bipolar transistor Q1 so as to quickly turn off the same, thereby facilitating and speeding up the high-to-low transition at the output terminal 14. The resistor R2 is used to quickly turn on the bipolar transistor Q2 during this high-to-low transition at the output terminal 14. It should be understood to those skilled in the art that the logic gate circuit 10 may be formed on a single silicon chip of a monolithic integrated circuit. Further, it will be noted that the bipolar transistors Q1 and Q2 are of the NPN-type conductivity.

Now, the operation of the logic gate circuit 10 of this invention constructed as described above will be explained. Assuming that the input logic signal $V_{in}$ is at a low or "0" state, this causes the second P-channel MOS transistor P2 to be rendered non-conductive and causes the first P-channel MOS transistor P1 and the bipolar transistor Q1 to be in the conductive states. As a result, the output terminal 14 will begin to go toward the high or "1" state. This output voltage $V_O$ in the high state will be equal to the supply voltage VCC less the sum of the voltage drop $V_{P1}$ across the channel of the MOS transistor P1 and the base-to-emitter voltage $V_{BE}$ drop across the bipolar transistor Q1. Generally, the $V_{P1}$ is about 0.2 volts and the $V_{BE}$ is about 0.8 volts. Thus, the output voltage $V_O$ in the high state be will approximately 4.0 volts. However, if the gate circuit 10 is used to conduct only during transitions such as when the output terminal 14 is connected to a capacitive load or a CMOS gate then the output voltage $V_O$ will be pulled up to the supply potential of +5.0 volts via the resistor R1 and the P-channel MOS transistor P1.

When the input logic signal $V_{in}$ at the input terminal 12 switches from the low level state and increases above the sum of the threshold voltages of the transistors P2 and Q2 or $V_{TH2}+V_{be2}$, the transistors P2 and Q2 will begin to be rendered conductive, thereby pulling down the output voltage $V_O$ at the output terminal 14. Since $V_{TH2}$ is about 1.5 volts and $V_{be2}$ is about 0.8 volts, this conduction will begin at about 2.3 volts. It will be noted that the transistor P1 does not turn off until the input logic signal $V_{in}$ exceeds a value equal to the supply voltage less the threshold drop across the transistor P1 or $VCC-V_{TH1}$. Since $V_{TH1}$ is about 1.5 volts, then the transistor P1 will not turn off until the input logic signal $V_{in}$ reaches about 3.5 volts. Therefore, when the input logic signal is between $V_{TH2}+V_{be2}$ (2.3 volts) and $VCC-V_{TH1}$ (3.5 volts) defining a transition region, this is the only time that both the transistors P1 and P2 are rendered conductive. Thus, low power consumption is realized since at all other times only one of the transistors P1 and P2 will be rendered conductive. It will also be noted that the noise margin has been increased due to the series connection of the P-channel MOS transistor P1 and the bipolar transistor Q1 and the series connection of the P-channel MOS transistor P2 and the bipolar transistor Q2.

Figure 2:
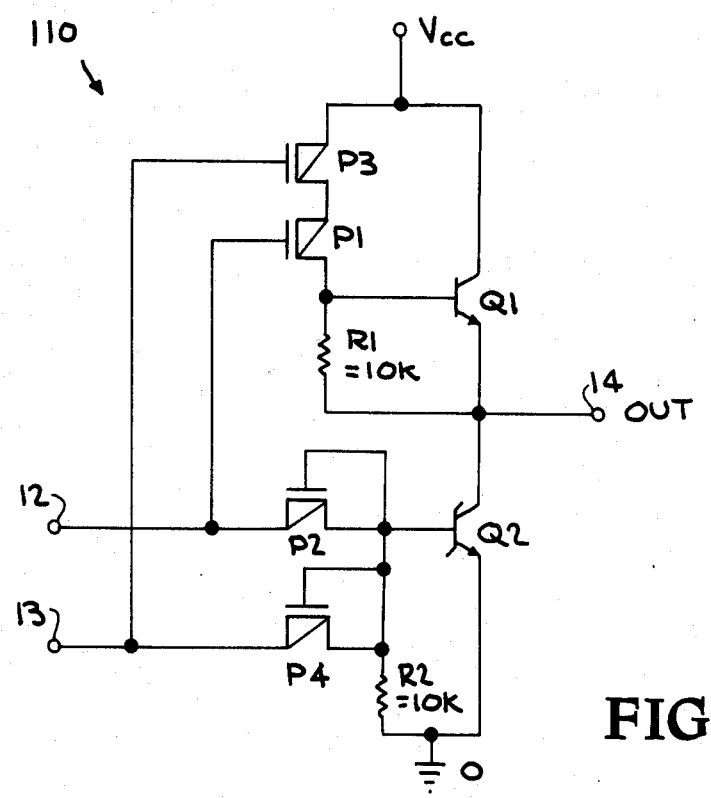
FIG. 2 is a schematic circuit diagram of a merged PMOS/bipolar logic circuit functioning as a NOR gate circuit in accordance with the present invention.

In FIG. 2, there is shown a merged PMOS/bipolar logic gate 110 of the present invention which functions as a NOR gate circuit. The NOR gate circuit 110 of FIG. 2 includes all of the components of the logic gate circuit 10 of FIG. 1 and further includes two additional P-channel MOS transistors P3 and P4. All of the components in FIG. 2 which are identical to those of FIG. 1 have been designated by the same reference numeral. Since the differences between FIG. 1 and FIG. 2 resides in the connection of the additional P-channel MOS transistors P3 and P4, only these connections will now be explained.

Specifically, the P-channel MOS transistor P3 has its source electrode connected to the supply potential VCC, its drain connected to the source of the P-channel transistor P1, and its gate connected to a second input terminal 13. The P-channel MOS transistor P4 has its gate and source electrodes connected together which are further connected to the junction of the base of the bipolar transistor Q2 and the resistor R2. The drain of the P-channel MOS transistor P4 is connected to the second input terminal 13 and to the gate of the P-channel MOS transistor P3.

From the foregoing detailed description, it can thus be seen that present invention provides a gate circuit formed of merged P-channel MOS transistors and bipolar transistors to produce a single logic gate functioning either as an inverter logic gate or a NOR logic gate. The merged PMOS/bipolar logic gate circuits of the present invention have the features of low power consumption and high immunity from spurious noise transients.

While there has been illustrated and described what are at present to be preferred embodiments of the present invention, it will be understood by those skilled in the art that various changes and modifications may be made, and equivalents may be substituted for elements thereof without departing from the true scope the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments following within the scope the appended claims.

What is claimed is:

1. An inverter circuit formed of merged P-channel MOS transistors and bipolar transistors to produce a single logic gate comprising:

a first P-channel MOS transistor having its gate connected to an input terminal and its source connected to a supply potential;

a first bipolar transistor having its collector connected to the supply potential, its base connected to the drain of said first P-channel transistor, and its emitter connected to an output terminal;

a first resistor having its one end connected to the drain of said first P-channel transistor and to the base of said first bipolar transistor, the other end of said first resistor being connected to the emitter of said first bipolar transistor and to the output terminal;

a second P-channel MOS transistor having its gate and source connected together and its drain connected to the gate of said first P-channel transistor and to the input terminal;

a second bipolar transistor having its collector connected to the output terminal, its base connected to the gate and source of said second P-channel transistor, and its emitter connected to a ground potential; and a second resistor having its one end connected to the base of said second bipolar transistor and its other end connected to the emitter of said second bipolar transistor.

2. An inverter circuit as claimed in claim 1, wherein said first bipolar transistor is of a NPN-type conductivity.

3. An inverter circuit as claimed in claim 1, wherein said second bipolar transistor is of a NPN-type conductivity.

4. An inverter circuit as claimed in claim 3, wherein said second bipolar transistor comprises a Schottky transistor.

5. An inverter circuit as claimed in claim 1, wherein said inverter circuit is formed on a single silicon chip of an integrated circuit.

6. A NOR circuit formed of merged P-channel MOS transistors and bipolar transistors to produce a single logic gate comprising:
   a first P-channel MOS transistor having its gate connected to a first input terminal;
   a first bipolar transistor having its collector connected to a supply potential, its base connected to the drain of said first P-channel transistor, and its emitter connected to an output terminal;
   a first resistor having its one end connected to the drain of said first P-channel transistor and to the base of said first bipolar transistor, the other end of said first resistor being connected to the emitter of said first bipolar transistor and to the output terminal;
   a second P-channel MOS transistor having its gate and source connected together and its drain connected to the gate of said first P-channel transistor and to the first input terminal;
   a second bipolar transistor having its collector connected to the output terminal, its base connected to the gate and source of said second P-channel transistor, and its emitter connected to a ground potential;
   a second resistor having its one end connected to the base of said second bipolar transistor and its other end connected to the emitter of said second bipolar transistor;
   a third P-channel MOS transistor having its gate connected to a second input terminal, its source connected to the supply potential, and its drain connected to the source of said first P-channel transistor; and
   a fourth P-channel MOS transistor having its gate and source connected together and to the base of said second bipolar transistor, the drain of said fourth P-channel transistor being connected to the gate of said third P-channel transistor and to the second input terminal.

7. A NOR circuit as claimed in claim 6, wherein said first bipolar transistor is of a NPN-type conductivity.

8. A NOR circuit as claimed in claim 6, wherein said second bipolar transistor is of a NPN-type conductivity.

9. A NOR circuit as claimed in claim 8, wherein said second bipolar transistor comprises a Schottky transistor.

10. A NOR circuit as claimed in claim 6, wherein said NOR circuit is formed on a single silicon chip of an integrated circuit.

* * * * *